United States Patent
Tong et al.

(10) Patent No.: US 6,723,630 B2
(45) Date of Patent: Apr. 20, 2004

(54) SOLDER BALL FABRICATION PROCESS

(75) Inventors: Ho-Ming Tong, Taipei (TW); Chun-Chi Lee, Kaohsiung (TW); Jen-Kuang Fang, Pingtung Hsien (TW); Min-Lung Huang, Kaohsiung (TW); Jau-Shoung Chen, Hsinchu (TW); Ching-Huei Su, Kaohsiung (TW); Chao-Fu Weng, Tainan (TW); Yung-Chi Lee, Kaohsiung (TW); Yu-Chen Chou, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/248,715

(22) Filed: Feb. 12, 2003

(65) Prior Publication Data

US 2003/0162379 A1 Aug. 28, 2003

(30) Foreign Application Priority Data

Feb. 27, 2002 (TW) ........................ 91103531 A

(51) Int. Cl.⁷ ............................................. H01L 21/44
(52) U.S. Cl. ........................................................ 438/613
(58) Field of Search ............................... 438/612, 613, 438/614

(56) References Cited

U.S. PATENT DOCUMENTS 6,555,296 B2 * 4/2003 Jao et al. ..................... 430/312
6,596,618 B1 * 7/2003 Narayanan et al. ......... 438/612

* cited by examiner

*Primary Examiner*—Evan Pert
*Assistant Examiner*—Monica D. Harrison
(74) *Attorney, Agent, or Firm*—Jiang Chyun IP Office

(57) ABSTRACT

A solder ball fabrication process for forming solder balls over a wafer having an active layer is provided. A plurality of patterned solder mask layers is sequentially formed over the active surface of the wafer. Each patterned solder mask layer has at least an opening that exposes a solder ball pad on the wafer. The opening of the patterned solder mask layers further away from the solder ball pad is larger in diameter than the opening of the patterned solder mask close to the solder ball pad. Solder material is deposited into the openings and a reflow process is conducted to melt the solder material together so that a solder ball is formed over the solder ball pad.

19 Claims, 3 Drawing Sheets

SOLDER BALL FABRICATION PROCESS

CROSS REFERENCE TO RELATED APPLICATIONS

This application claims the priority benefit of Taiwan application serial no. 91103531, filed Feb. 27, 2002.

BACKGROUND OF INVENTION

1. Field of Invention

The present invention relates to a solder ball fabrication process. More particularly, the present invention relates to a solder ball fabrication process for the fabrication of a wafer-level chip scale package (WLCSP).

2. Description of Related Art

Due to the trend of developing light and compact electronic products, the size of most integrated circuit packages continues to decrease. To reduce the size of integrated circuit (IC) packages, chip scale packages (CSP) have been developed. In general, the edge length of a CSP package is roughly 1.2 times the edge length of a silicon chip or the chip/package has an area ratio of about 80% and the pitch between leads is limited to a value under 1 mm. Many types of chip scale packages are now available. However, the most common type is one having the package directly formed on the wafer, known also as a wafer-level chip scale package (WLCSP).

One major characteristic of a WLCSP is the fabrication of a redistribution circuit (RC) on the surface of the chip so that the bonding pads originally positioned around the periphery of the chip are redistributed as an area array on top of the chip. Hence, the entire surface of the chip can be utilized for accommodating bonding pads, thereby producing a larger pitch between bonding pads to meet the larger distance of separation between contacts on a printed circuit board (PCB). In addition, solder balls are attached to the bonding pads of the chip manually or automatically so that the bonding pads on the chip are electrically connected to the contacts on the PCB through the solder balls.

However, if the positions of the original bonding pads and pitch between the original bonding pads on the chip match the contact pitch in the printed circuit board, there is no need to form the redistribution circuit on the chip. In other words, the solder balls may be directly attached to the original bonding pads on the chip. In the following description, the solder ball pads refer to all the bonding pads on a chip requiring solder ball attachment, for example, including the original bonding pad on the chip or the bonding pads on the redistribution circuit above the chip.

As integrated circuit design progresses and the level of integration continues to increase, the number of output pads in a chip also increases. Yet, surface area of the chip often remains identical or is reduced slightly. Under such circumstances, the conventional solder ball attachment technique can hardly accommodate fine solder balls. Ultimately, small fine pitch solder balls have to be used in the fabrication of WLCSP.

Furthermore, the conventional solder ball attachment technique can be roughly classified into the automatic ball attachment method and the manual ball attachment method. The automatic ball attachment method costs more to operate, especially for attaching small fine pitch solder ball. Although the manual ball attachment method is less expensive to operate, substantial labor force is required and overall ball attachment efficiency is relatively low. Since it is difficult to attach small fine pitch solder balls to the bonding pad of a chip in a WLCSP, a larger size bump is often attached to the bonding pad of the chip instead of a solder ball.

Because lead-tin alloy has a good bonding strength as well as physical and conductive properties, lead-alloy is often used as a solder material for joining devices on a chip with contacts on the printed circuit board in the fabrication of integrated circuit packages. However, lead is a toxic material that often causes health hazards and environmental concerns. Thus, the electronic industry is actively looking for a lead-free substitute for the lead-containing solder material. At present, a number of lead-free solder materials have already been developed. In the near future, all lead-containing solder material will be replaced.

SUMMARY OF INVENTION

Accordingly, one object of the present invention is to provide a solder ball fabrication process for directly forming a solder ball on the bonding pad or solder ball pad of a wafer in a wafer level chip scale package (WLCSP). The solder ball fabrication process not only increases production rate, but the size and height of the solder ball is also much easier to control within the required range.

To achieve these and other advantages and in accordance with the purpose of the invention, as embodied and broadly described herein, the invention provides a solder ball fabrication process for producing at least one solder ball on a wafer. The wafer has an active surface, a passivation layer and at least one bonding pad. The passivation layer and the bonding pad are formed on the active surface of the wafer such that the passivation layer exposes the bonding pad. The wafer further includes a stress buffer layer and at least one under-ball-metallurgy layer. The under-ball-metallurgy layer is formed over the bonding pad. The stress buffer layer is formed over the passivation layer. The stress buffer layer has an opening that exposes the under-ball-metallurgy layer. First, a patterned first solder mask layer is formed over the stress buffer layer. The first solder mask has at least one first opening that exposes the under-ball-metallurgy layer. Thereafter, a patterned second solder mask layer is formed over the first solder mask layer. The second solder mask layer has at least a second opening located at a position corresponding to the first opening and exposing the under-ball-metallurgy layer. The second opening also has a diameter greater than that of the first opening. A solder material is deposited into the first and second opening and then a reflow process is carried out so that the solder material inside the openings melts to form a solder ball above the under-ball-metallurgy layer. Finally, the first solder mask layer and the second solder mask layer are removed.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
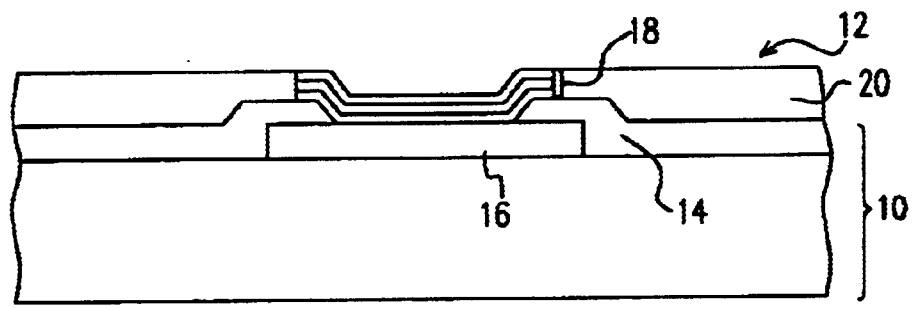
FIGS. 1 to 6 are schematic cross-sectional views showing the steps carried out in a solder ball fabrication process according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1 to 6 are schematic cross-sectional views showing the steps carried out in a solder ball fabrication process according to one preferred embodiment of this invention. As shown in FIG. 1, a wafer having an active surface 12, a passivation layer 14 and a plurality of solder ball pads 16 (only one is shown) is provided. The passivation layer 14 and the solder ball pads 16 are formed on the active surface 12 of the wafer such that the passivation layer 14 exposes the solder ball pad 16. Note that the solder ball pad 16 refers to any bonding pads or connection pads on the wafer 10. The wafer 10 further includes a plurality of under-ball-metallurgy (UBM) layers 18 (only one is shown) and a stress buffer layer 20. The under-ball-metallurgy layer 18 is formed over the solder ball pad 16 and the stress buffer layer 20 is formed over the passivation layer 14. The stress buffer layer 20 also exposes the under-ball-metallurgy layer 18.

The wafer 10 may be packaged according to a chip scale package (CSP) so that a chip cut out from a wafer is mounted onto a carrier. Damages to the chip and other package structures may occur due to thermal stress resulting from differences in coefficient of thermal expansion (CTE) between the chip and the carrier. The stress buffer layer 20 is used to buffer the thermal stress between the chip and the carrier so that structural damage between the chip and the carrier is minimized. The stress buffer layer is commonly fabricated using a material such as benzocyclobutene (BCB).

The under-ball-metallurgy layer 18 is designed to increase the bonding strength between a solder ball 34 and the solder ball pad 16 as shown in FIG. 7. In the meantime, the under-ball-metallurgy layer 18 also serves to prevent the inter-diffusion of metallic elements and avoid the oxidation of metallic layers. The under-ball-metallurgy layer 18 is usually formed before the stress buffer layer 20. Photolithographic process together with evaporation, sputtering or electroplating processes are often used to fabricate the under-ball-metallurgy layer 18. An alternative method of forming the under-ball-metallurgy layer 18 is to form an under-ball-metallurgy layer over the active surface 12 of the wafer 10 globally and performing photolithographic and etching process in sequence to pattern the under-ball-metallurgy layer. Furthermore, the under-ball-metallurgy layer typically includes a stack of metallic layers such as a wetting layer, a barrier layer and an adhesion layer. These metallic layers are fabricated using a single type of metal such as copper, chromium, titanium, tungsten, silver, nickel, vanadium and aluminum or an alloy of some of the above metals.

Figure 2:
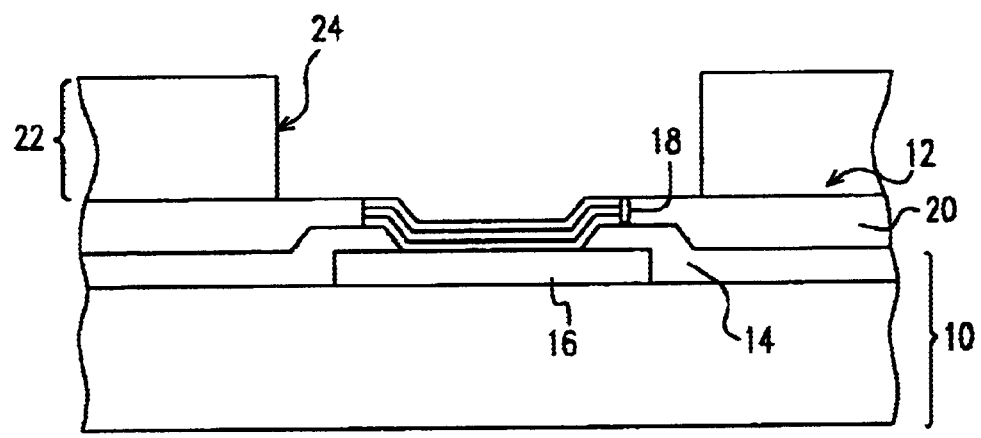

As shown in FIG. 2, a patterned first solder mask layer 22 is formed over the stress buffer layer 20. The patterned first solder mask layer 22 has a plurality of first openings 24 (only one is shown) that exposes the under-ball-metallurgy layer 18. The patterned first solder mask layer 22 is formed in a lamination process, for example. In the lamination process, a photosensitive dry film is adhered to the surface of the stress buffer layer 20. Thereafter, the photosensitive dry film is patterned using a photo-via method or some other method to form a first opening 24 in the first solder mask layer 22.

Figure 3:
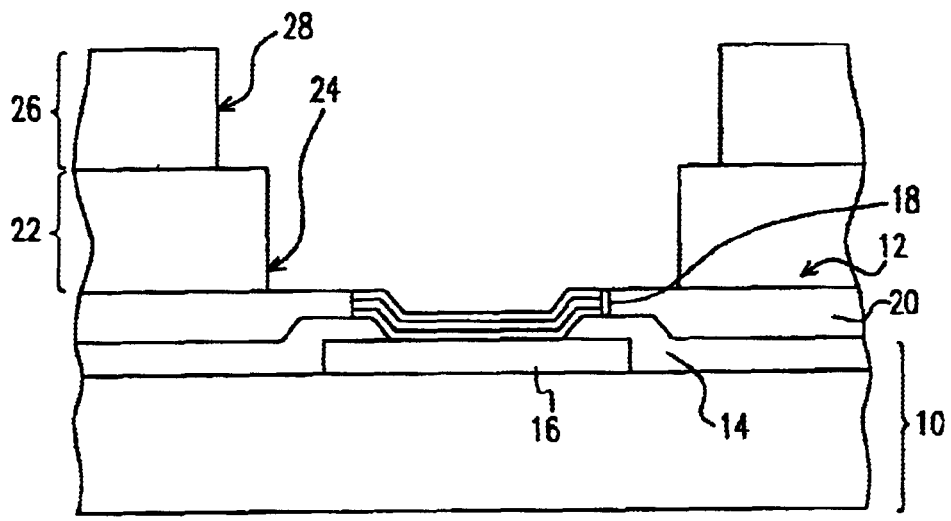

To provide a larger area for depositing solder material, a patterned second solder mask layer 26 is similarly formed over the first solder mask layer 22 as shown in FIG. 3. The second solder mask layer 26 has a second opening 28 corresponding to the first opening 24 and exposing the under-ball-metallurgy layer 18. Note that the second opening 28 has a diameter greater than that of the first opening 24 so that the first opening 24 and the second opening 28 together form a cavity structure having a staircase profile.

When both the first solder mask 22 and the second solder mask 26 are fabricated using photosensitive dry film, a thinner first solder mask layer 22 is usually formed over the active surface 12 of the wafer so as to smooth out the rugged wafer surface. Thereafter, a thicker second solder mask layer 26 is formed over the first solder mask layer 22 so that the second solder mask layer 26 has a plane upper surface. A plane second solder mask layer 26 has big advantage when carrying out photo-exposure and development. Ultimately, the second opening 28 in the second solder mask layer 26 has a sectional area and depth dimension that varies very little.

Figure 4:
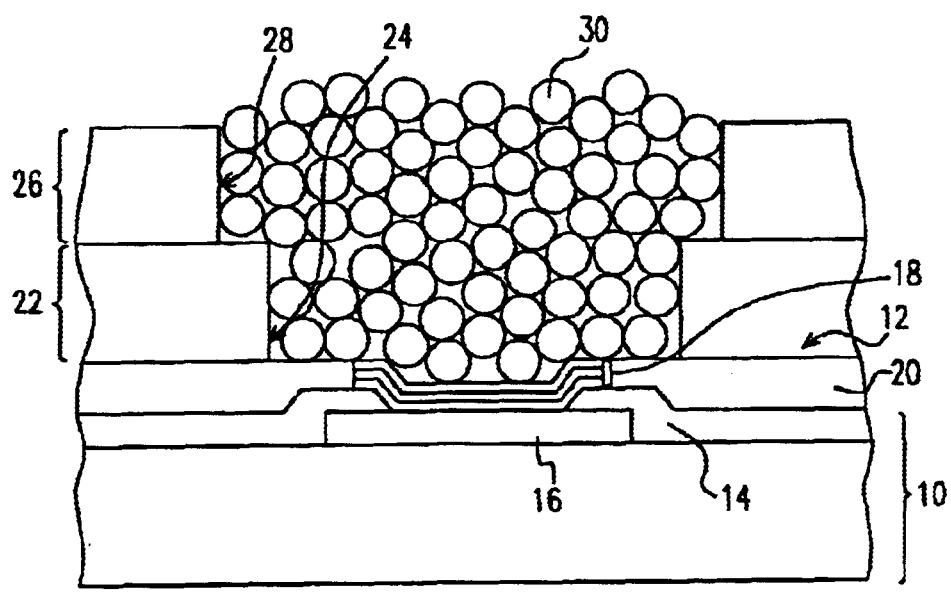

As shown in FIG. 4, a printing method or some other method is applied to deposit solder material 30 into the first opening 24 and the second opening 28. The solder material 30 in solder powder form or solder paste form accumulates over the under-ball-metallurgy layer 18 inside the first opening 24 and the second opening 28.

Figure 5:
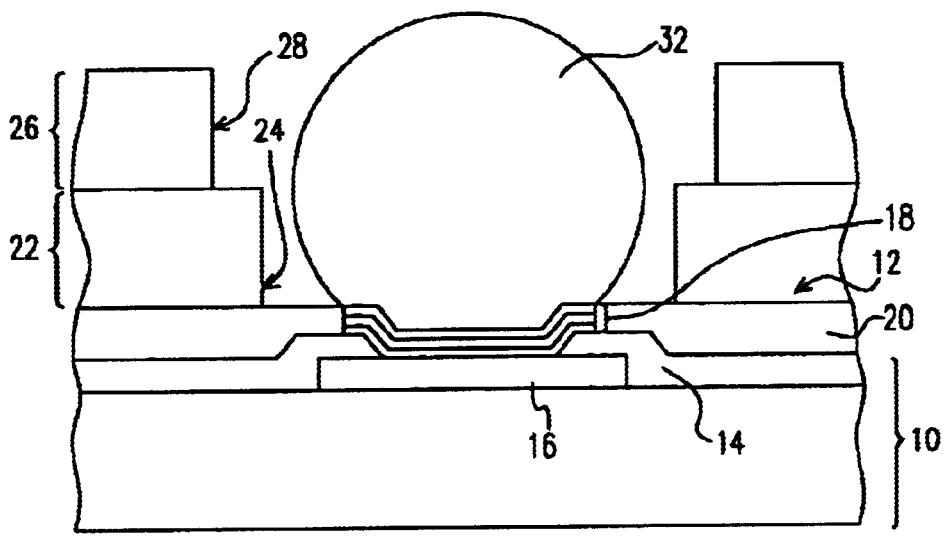

A first reflow process is conducted so that the solder material 30 melts together and forms a solder ball 32 on top of the under-ball-metallurgy layer 18 as shown in FIG. 5. During the reflow process, due to surface tension of the solder material 30 in a melt, the mass of solder material 30 solidifies into a spherical solder ball 32. Finally, as shown in FIG. 6, the first solder mask layer 22 and the second solder mask layer 26 are removed to expose the solder ball 32 above the active surface 12 of the wafer 10.

Figure 6:
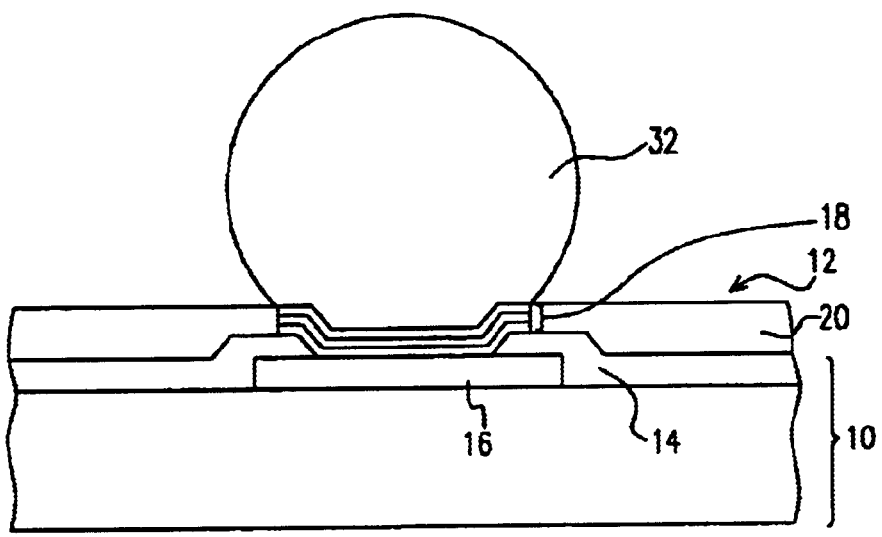

A shown in FIGS. 5 and 6, the solder ball 32 on the wafer 10 has a diameter of about 400 $\mu$m. To form a solder ball having such a size, an under-ball-metallurgy layer 18 having a diameter of about 150 $\mu$m, a first opening 24 having a width of about 700 $\mu$m and a second opening 28 having a width of about 900 $\mu$m, for example, are fabricated.

Aside from forming two patterned solder mask layers, this invention also permits a repetition of the aforementioned steps to form three or more patterned solder mask layers so that area for depositing solder material and height for accumulating the solder material is further increased. To facilitate the dropping of solder material into the opening using the printing method, diameter of the openings further away from the solder ball pad is larger than the diameters of the openings closer to the solder ball pad. In other words, the stack of openings contributed by various solder mask layers together constitute a staircase-like or inverted frustum-cone-like cavity structure that aids the reception of depositing solder material.

The solder ball fabrication process according to this invention can also be used to form a solder bump over a wafer. In this case, soldering material is deposited into the opening. However, due to environmental or heath reasons, soldering materials containing lead are soon to be phased out. Hence, lead-free solder material must be used to fabricate the solder ball in the future. In other words, this invention can be applied to form leaded as well as lead-free solder bumps.

In summary, the solder ball fabrication process according to this invention includes forming two or more patterned solder mask layers on the active surface of a wafer. Through the aligned openings in various solder mask layers that also expose the solder ball pad, a wide and deep cavity structure for accumulating solder material is provided. Hence, a large and deep solder ball is formed on the wafer after solder material deposition and a reflow process. The fabrication process not only increases production rate, but also increases the size and height of each solder ball over the under-ball-metallurgy layer to meet various designs. In addition, the solder ball fabrication process of this invention may use different kinds of solder materials to form either leaded or lead-free solder bumps.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A solder ball fabrication process for producing at least one solder ball on a wafer, wherein the wafer has an active surface, a passivation layer and at least one solder ball pad, the passivation layer and the solder ball pad are on the active surface of the wafer with the passivation layer exposing the solder ball pad, the wafer further includes a stress buffer layer and an under-ball metallurgy layer, the under-ball-metallurgy layer is on the solder ball pad and the stress buffer layer is on the passivation layer exposing the under-ball-metallurgy layer, the solder ball production process at least comprising the steps of:

forming a first patterned solder mask layer over the stress buffer layer, wherein the first patterned mask layer has at least a first opening that exposes the under-ball-metallurgy layer;

forming a second patterned solder mask layer over the first patterned solder mask layer, wherein the second patterned solder mask layer has at least one second opening corresponding to the first opening exposing the solder ball pad and the second opening has a diameter greater than a diameter of the first opening;

depositing a solder material into the first and the second openings;

conducting a reflow process so that the solder material melts to form a solder ball over the under-ball-metallurgy layer; and removing the first patterned solder mask layer and the second patterned solder mask layer.

2. The process of claim 1, wherein the first patterned solder mask layer has a thickness smaller than that of the second patterned solder mask layer.

3. The process of claim 1, wherein the solder ball is a leaded solder ball or a lead-free solder ball.

4. The process of claim 1, wherein the first patterned solder mask layer includes a dry film.

5. The process of claim 4, wherein the step of forming the first patterned solder mask layer includes laminating a solder mask layer over the stress buffer layer and then patterning the solder mask layer.

6. The process of claim 5, where the step of patterning the first solder mask layer includes conducting a photo-via method.

7. The process of claim 1, wherein the second patterned solder mask layer includes a dry film.

8. The process of claim 7, wherein the step of forming the second patterned solder mask layer includes laminating a solder mask layer over the first solder mask layer and then patterning the solder mask layer.

9. The process of claim 8, where the step of patterning the second patterned solder mask layer includes conducting a photo-via method.

10. The process of claim 1, wherein the solder material is solder powder or solder paste.

11. The process of claim 1, wherein the step of depositing the solder material into the first and the second openings includes printing.

12. A solder ball fabrication process for producing at least one solder ball on a wafer, wherein the wafer has an active surface, a passivation layer and at least one solder ball pad, the passivation layer and the solder ball pad are on the active surface of the wafer with the passivation layer exposing the solder ball pad, the wafer further includes a stress buffer layer and an under-ball metallurgy layer, the under-ball-metallurgy layer is on the solder ball pad and the stress buffer layer is on the passivation layer exposing the under-ball-metallurgy layer, the solder ball production process at least comprising the steps of:

sequentially forming a plurality of patterned solder mask layers over the stress buffer layer, wherein each of the patterned solder mask layers has at least an opening that exposes the under-ball-metallurgy layer, and the opening of the patterned solder mask layers further away from the solder ball pad is larger in diameter than the opening of the patterned solder mask close to the solder ball pad;

depositing a solder material into the openings;

conducting a reflow process so that the solder material melts to form a solder ball over the under-ball-metallurgy layer; and removing the patterned solder mask layers.

13. The process of claim 12, wherein the patterned solder mask layer closest to the solder ball pad has a thickness smaller than a thickness of the other patterned solder mask layers further away.

14. The process of claim 12, wherein the solder ball is either a leaded solder ball or a lead-free solder ball.

15. The process of claim 12, wherein the patterned solder mask layers are dry films.

16. The process of claim 12, wherein the step of forming the patterned solder mask layers includes laminating a plurality of solder mask layers over the stress buffer layer and then patterning the solder mask layers.

17. The process of claim 16, where the step of patterning the solder mask layers includes conducting a photo-via method.

18. The process of claim 12, wherein the solder material is solder powder or solder paste.

19. The process of claim 12, wherein the step of depositing the solder material into the openings includes printing.

* * * * *